(12) United States Patent
Cariello

(10) Patent No.: US 12,230,232 B2
(45) Date of Patent: Feb. 18, 2025

(54) CONFIGURABLE TYPES OF WRITE OPERATIONS

(71) Applicant: Micron Technology, Inc., Boise, ID (US)

(72) Inventor: Giuseppe Cariello, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 135 days.

(21) Appl. No.: 17/818,613

(22) Filed: Aug. 9, 2022

(65) Prior Publication Data
US 2024/0054971 A1    Feb. 15, 2024

(51) Int. Cl.
*G09G 5/08* (2006.01)
*G06F 13/16* (2006.01)
*G11C 7/10* (2006.01)
*G11C 16/10* (2006.01)

(52) U.S. Cl.
CPC .......... *G09G 5/08* (2013.01); *G06F 13/1673* (2013.01); *G11C 7/10* (2013.01); *G11C 16/102* (2013.01)

(58) Field of Classification Search
CPC ......... G09G 5/08; G06F 13/1673; G11C 7/10; G11C 16/102
See application file for complete search history.

(56) References Cited

U.S. PATENT DOCUMENTS

| 2014/0215129 | A1* | 7/2014 | Kuzmin | G06F 12/0246 |
| | | | | 711/103 |
| 2019/0004980 | A1* | 1/2019 | Maor | G06F 16/10 |
| 2020/0167273 | A1* | 5/2020 | Byun | G06F 13/1673 |
| 2021/0255783 | A1* | 8/2021 | Ou | G06F 3/0659 |

FOREIGN PATENT DOCUMENTS

WO    WO-2015064850 A1 *  5/2015    ......... G06F 13/1673

* cited by examiner

*Primary Examiner* — Masud K Khan
(74) *Attorney, Agent, or Firm* — Holland & Hart LLP

(57) ABSTRACT

Methods, systems, and devices for configurable types of write operations are described. A memory device may receive a write command to write data in a zone of a memory system. The memory device may identify a physical address to store the data using a cursor associated with the zone based at least in part on receiving the write command. In some examples, the cursor may be associated with a type of a write operation based on a quantity of data associated with the cursor. As such, the memory device write, using a first type of the write operation or a second type of the write operation in accordance with the quantity of data, the data, and an indication of the type of the write operation used to write the data into the memory system.

24 Claims, 7 Drawing Sheets

CONFIGURABLE TYPES OF WRITE OPERATIONS

FIELD OF TECHNOLOGY

The following relates to one or more systems for memory, including configurable types of write operations.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
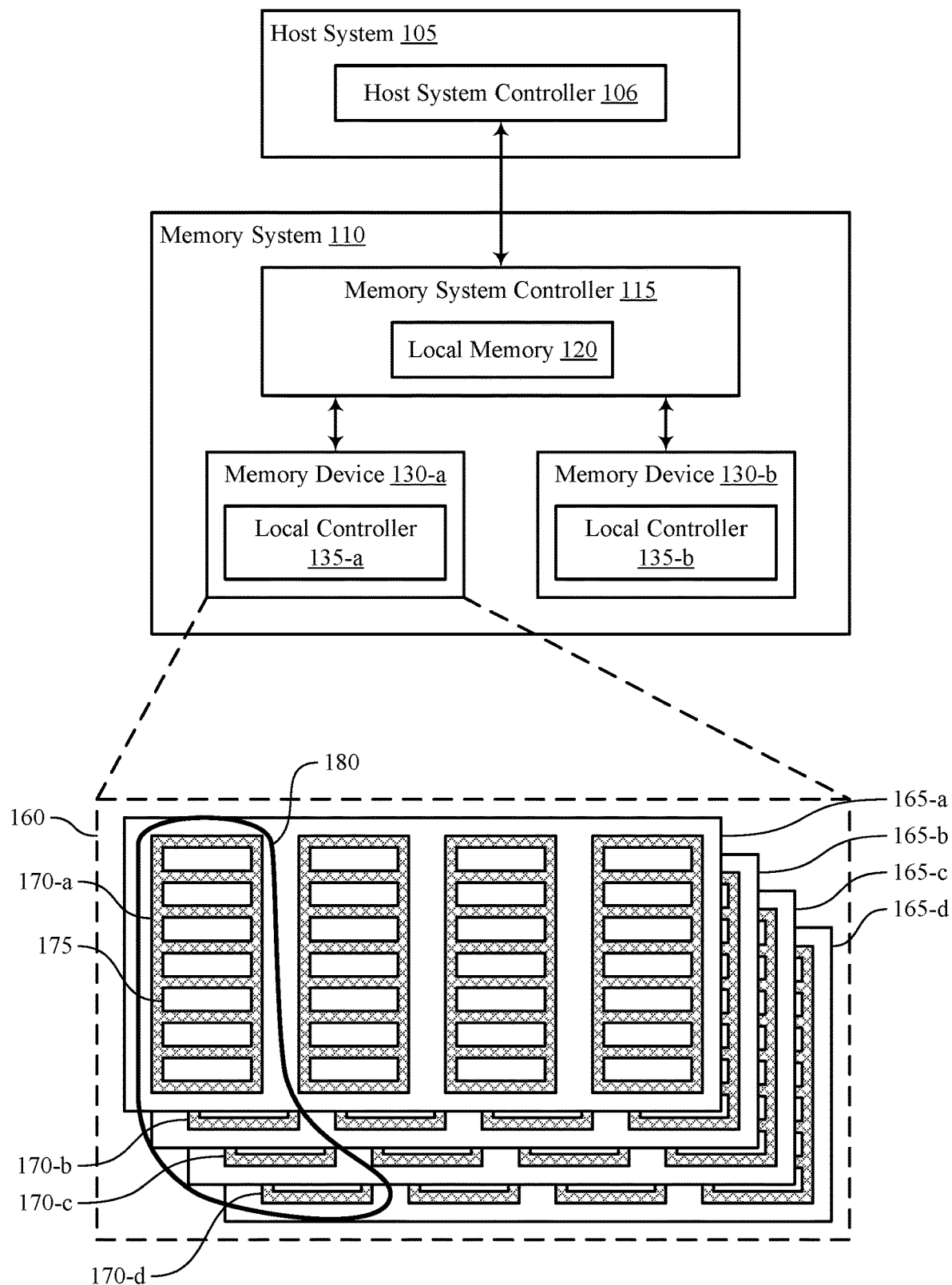
FIG. 1 illustrates an example of a system that supports configurable types of write operations in accordance with examples as disclosed herein.

Memory devices of a memory system may store data at a corresponding physical address, where a physical address may identify a physical location of a corresponding memory cell within a memory device. The physical location of data within the memory device may change over time due to the memory device writing additional data, maintenance operations performed by the memory device (e.g., garbage collection operations), or for various other reasons. A host system coupled with the memory system may reference data (e.g., if issuing read, write, or other commands associated with the data) using logical addresses (e.g., logical block addresses (LBAs), virtual addresses, system addresses, or other logical addresses), and the memory system may generate and maintain mapping information (e.g., a logical to physical (L2P) table). The mapping information may include a mapping between the logical addresses associated with the data and the physical addresses of the memory cells at which the data is stored, which may support the memory device changing the physical addresses over time. In some examples, the memory devices may compress the L2P table to save memory space in both not-and (NAND) memory devices and static random access memory (SRAM) of the memory system. As such, to retrieve the L2P table after being compressed, the memory devices may identify how the data (e.g., host data or L2P data) is stored in the NAND (e.g., via a multi-plane write operation or via a plane write operation).

Additionally or alternatively, the memory devices may compress the mapping of data written in the memory system in accordance with a zoned namespace (ZNS) architecture. For example, the ZNS architecture may utilize a command set that exposes a zoned block storage between the host system and the memory system (e.g., the logical address space is divided into fixed-sized zones, where each zone may be written sequentially to the memory system). In accordance with ZNS architecture, more zones may be open (e.g., to receive host data) at a given time, and as such the memory system may allocate SRAM to each zone for data buffering. In some examples, the size of the buffer may match a write granularity of a write operation (e.g., where an increase in granularity may correspond to an increase in writing parallelism and performance). For example, a multi-plane write operation may write data to multiple planes of the memory system in parallel. Additionally or alternatively, the plane write operation may allow for a sequential writing which may write data at a slower rate and have a smaller buffer size relative to the multi-plane and multi-dice write operations. As such, depending on the number of open zones, the use of sequential writing may result in a decrease in performance as the quantity of SRAM allocated to each zone increases.

According to the techniques described herein, the memory device may dynamically switch between the various types of write operations while operating in accordance with the ZNS architecture. For example, each zone may have an associated cursor, where the host system may allocate a respective amount of data to each cursor. As such, the memory device may allocate a cursor with the largest amount of data to a first buffer of a first size associated with the multi-plane or multi-die write operation. In some examples, the memory system may benefit from a reduction data garbage collection by writing data from the first buffer after the first buffer is full. If the cursor determines to flush data before filling the first buffer, one or more second buffers of a second size associated with the plane operation may be used. In response to using multiple write operation types to write the data, each portion of data may have a different storage layout in the memory system and as such may use respective mapping compression algorithms. For example, with reference to address translation in reading and mapping rebuild (e.g., in case of power loss) the indication of what type of write operation that was used to program the data into the memory cells of the memory system may be stored in a dedicated table and in meta data of the memory system. As such, if a first portion of data was stored with the multi-plane write operation, then the first portion of data may be read via a multi-plane read operation and if a second portion data was stored with the plane write operation, then the second portion of data may be read via a plane read operation. By dynamically switching between the multiple write operation types, the memory system may benefit from the writing efficiency of the multi-plane write operation for larger portions of data and may benefit from the smaller granularity of the plane write operation for smaller portions of data.

Figure 2:
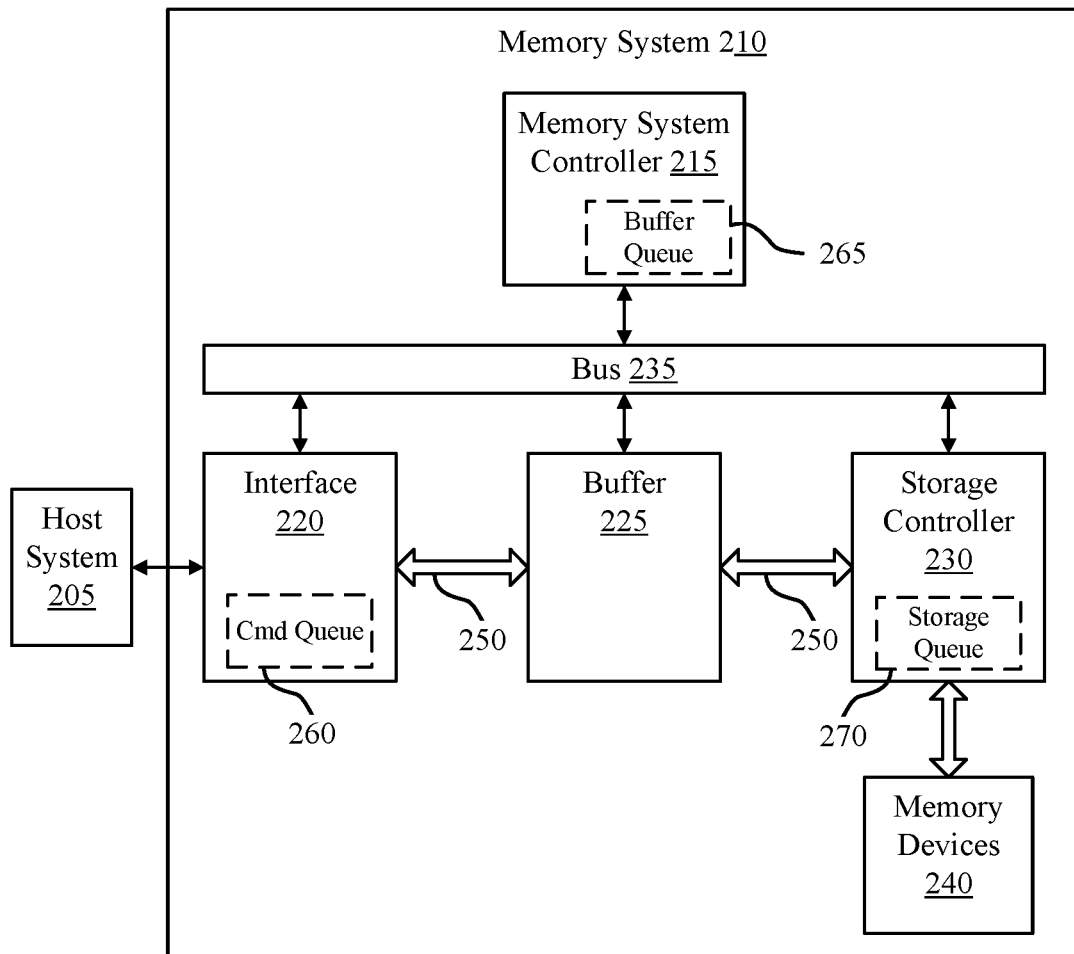
FIG. 2 illustrates an example of a system that supports configurable types of write operations in accordance with examples as disclosed herein.

Features of the disclosure are initially described in the context of systems, with reference to FIGS. 1 through 2. Features of the disclosure are described in the context of data flow diagrams, zone mapping schemes, and process flows with reference to FIGS. 3 through 5. These and other features of the disclosure are further illustrated by and described in the context of an apparatus diagram and flowchart that relate to configurable types of write operations with reference to FIGS. 6 through 7.

FIG. 1 illustrates an example of a system 100 that supports configurable types of write operations in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMN interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MHLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained, and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

In some examples of system 100, the memory devices 130 may compress data of the memory system 110 in accordance with a ZNS architecture. For example, the ZNS architecture may utilize a command set that exposes a zoned block storage between the host system 105 and the memory system 110 (e.g., the logical address space is divided into fixed-sized zones, where each zone may be written sequentially to the memory system). In such systems, the host system may control the physical locations that data is stored in the ZNS architecture. For example, a ZNS architecture may not have concepts of L2P mappings because data may be written sequentially into each zone. As such, ZNS architecture may compress strings of data sequentially, which may make switching between different types of write operations difficult. For example, a multi-plane write operation may write data to multiple planes of the memory system in parallel, but may have a larger associated buffer which may lead to a greater collection of garbage data in cases where the amount of data to write is less than the size of the buffer. Additionally or alternatively, the plane write operation may allow for a sequential writing which may be advantageous for ZNS compression techniques, but may write data at a slower rate and have a smaller buffer size relative the multi-plane write operation.

The memory devices 130 may dynamically switch between the various types of write operations while operating in accordance with the ZNS architecture. For example, each fixed-size zone may have an associated cursor, where the host system 105 may allocate a respective amount of data to each cursor. As such, a memory device 130 may allocate a cursor with the largest amount of data to a first buffer of a first size associated with the multi-plane write operation. In some examples, the memory system 110 may benefit from a reduction data garbage collection by writing data from the first buffer after the first buffer is full.

If the cursor has remaining data after filling the first buffer, one or more second buffers of a second size associated with the plane operation may be used. In response to using multiple write operation types to write the data, each portion of data may be written with an indication of what type of write operation was used to program the data into the memory cells of the memory system 110. As such, if a first portion of data was stored with the multi-plane write operation, then the first portion of data may be read via a multi-plane read operation and if a second portion data was stored with the plane write operation, then the second portion of data may be read via a plane read operation. By dynamically switching between the multiple write operation types, the memory system 110 may benefit from the writing efficiency of the multi-plane write operation for larger portions of data and may benefit from the sequential writing of the plane write operation for smaller portions of data.

FIG. 2 illustrates an example of a system 200 that supports configurable types of write operations in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point or other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands, and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, after completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. After receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received after the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

After a determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, performing garbage collection). The entries may be added to the storage queue 270, e.g., by the memory system controller 215. The entries may be removed from the storage queue 270 (e.g., by the storage controller 230 or memory system controller 215) after completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, after the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In some examples of system 200, the memory system controller 215 may compress data of the memory system 210 in accordance with a ZNS architecture. For example, the ZNS architecture may utilize a command set that exposes a zoned block storage between the host system 205 and the memory system 210 (e.g., the logical address space is divided into fixed-sized zones, where each zone may be written sequentially to the memory system). As such, ZNS architecture may compress strings of data sequentially, which may make switching between different types of write operations difficult. For example, a multi-plane write operation may write data to multiple planes of the memory system in parallel, but may have a larger associated buffer 225 which may lead to a greater collection of garbage data in cases where the amount of data to write is less than the size of the buffer 225. Additionally or alternatively, the plane write operation may allow for a sequential writing which may be advantageous for ZNS compression techniques, but may write data at a slower rate and have a smaller buffer 225 size relative the multi-plane write operation.

The memory system controller 215 may dynamically switch between the various types of write operations while operating in accordance with the ZNS architecture. For example, each fixed-size zone may have an associated cursor, where the host system 205 may allocate a respective amount of data to each cursor. As such, the memory system controller 215 may allocate a cursor with the largest amount of data to a first buffer 225 of a first size associated with the multi-plane write operation. In some examples, the memory system 210 may benefit from a reduction data garbage collection by writing data from the first buffer 225 after the first buffer 225 is full.

If the cursor has remaining data after filling the first buffer 225, one or more second buffers 225 of a second size associated with the plane operation may be used. In response to using multiple write operation types to write the data, each portion of data may be written with an indication of what type of write operation was used to program the data into the memory cells of the memory system 210. As such, if a first portion of data was stored with the multi-plane write operation, then the first portion of data may be read via a multi-plane read operation and if a second portion data was stored with the plane write operation, then the second portion of data may be read via a plane read operation. By dynamically switching between the multiple write operation types, the memory system 110 may benefit from the writing efficiency of the multi-plane write operation for larger portions of data and may benefit from the sequential writing of the plane write operation for smaller portions of data.

Figure 3:
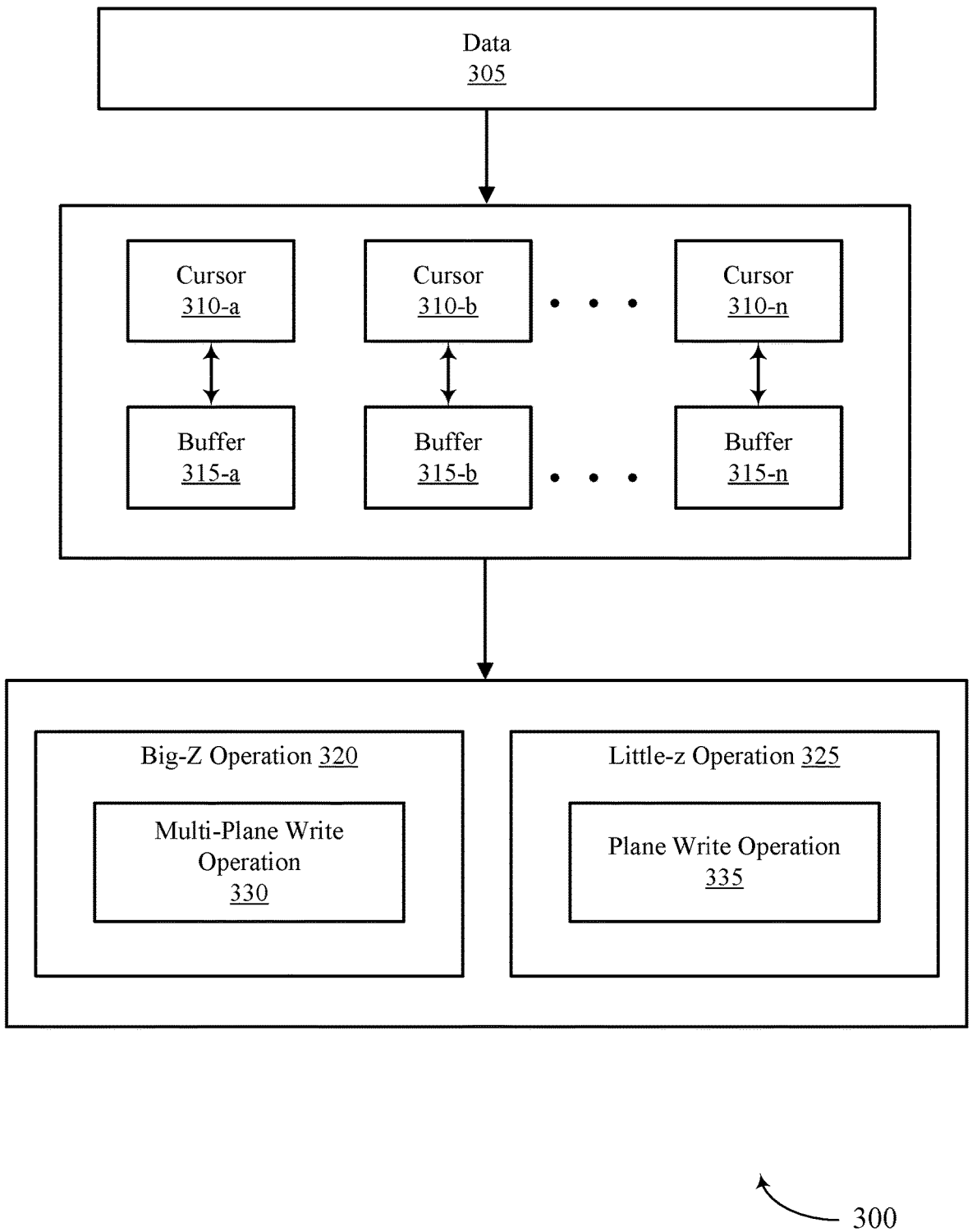
FIG. 3 illustrates an example of a data flow diagram that supports configurable types of write operations in accordance with examples as disclosed herein.

FIG. 3 illustrates an example of a data flow diagram 300 that supports configurable types of write operations in accordance with examples as disclosed herein. In some examples, data flow diagram 300 may be implemented by one or more aspects of systems 100 and/or 200. For instance, data flow diagram 300 may be implemented by a memory system 110 and host system 105 as described with reference to FIG. 1 and/or a memory system 210 and host system 205 as described with reference to FIG. 2. For instance, a big-z operation 320 or a little-z operation 325 may examples of data writing and reading techniques used to store one or more portions of data to pages 175 of a die 160. Additionally, or alternatively, aspects of the data flow diagram 300 may be implemented as instructions stored in memory (e.g., firmware stored in a memory coupled with a controller). For example, the instructions, in response to being executed by a controller (e.g., the memory system controller 115), may cause the controller to perform the operations of the data flow diagram 300.

As illustrated in in FIG. 3, a memory system may receive data 305. In some examples, the data 305 may be associated with receiving, from a host system one or more write commands to write data. Additionally or alternatively, the memory system and host system may operate in accordance with a ZNS architecture, and as such the write command may indicate a zone in which to write the data. In some cases, the zone may be associated with a region of a die 160, such as one or more pages 175, one or more blocks 170, one or more planes 165, or a combination thereof.

Additionally or alternatively, each zone may be associated with a one or more cursors 310. For example, as illustrated in FIG. 3, respective portions of the data 305 may be allocated to cursors 310-a, 310-b, through 310-n. In some examples, a cursor 310 may be a data structure (e.g., a pointer) that may indicate a set of physical addresses associated with the die 160 that the respective position of data 305 may be set to be written to. In some cases, each respective portion of data 305 may have a respective size. For example, cursor 310-a may have a first portion of data 305 that is greater than a second portion of data 305 associated with cursor 310-b. In some examples, the portion of data 305 associated with a cursor 310 may be in response to a quantity of write commands pending (e.g., in the queue) for the cursor 310.

In some examples, the memory system may write data to one or more associated memory cells using various data writing techniques. For example, the memory system may operate in accordance with a big-z operation 320, in which the memory system may use a first type of write operation (e.g., a multi-plane write operation 330 or a set of multi-plane write operations 330 in parallel on multiple dice and channels). For instance, the multi-plane write operation 330 may be a method of writing information concurrently to multiple planes 165 of the memory system. That is, a sequential string of data 305 that may be dispersed across multiple planes 165. As such, the sequential data 305 written using the multi-plane write operation 330 may be read using a first type of read operation (e.g., a multi-plane read operation 335). For instance, the multi-plane read operation may read the data 305 dispersed across the multiple planes 165 in parallel which may increase the read rate in accordance with buffer availability. By concurrently writing across multiple planes 165, the memory system may benefit from an increase in writing efficiency while using the multi-planes write operation 330 as well as an increase in reading efficiency while using a multi-planes read operation. In some examples, the type of read operation used to read stored data 305 may be in response to the quantity of data 305 requested in the read operation and a size of an available buffer 315. For instance, a single-plane read operation 345 may be used to read a portion of the data 305 stored via a big-z layout. Additionally or alternatively, a multi-plane read operation may be used to read a portion the data 305 stored via a little-z layout, if the memory system requests a buffer 315 size to hold out of order data 305 before sending the data 305 to the host system.

Additionally or alternatively, the memory system may operate in accordance with a little-z operation 325, in which the memory system may use a second type of write operation (e.g., a plane write operation 335). For instance, the plane write operation 335 may be a method of writing the data 305 sequentially to one or more planes 165 of the die 160. In some examples, a plane write operation 335 may be an example of a single-plane write operation. In some examples, a plane write operation 335 may be an example of two-plane write operation. As such, the data 305 written using the plane write operation 335 may be read using a second type of read operation (e.g., a plane read operation). For instance, the plane read operation may read the data 305 sequentially as it was stored to the single plane 165. By sequentially writing to a single plane 165, the memory system may benefit from smaller write granularity and benefit from ZNS L2P compression efficiency while using the plane write operation 335. In some examples, a read operation may be an example of a single-plane read operation. In some examples, a plane read operation may be an example of multi-plane read operation.

In some examples, a given cursor 310 may be associated with a respective buffer 315. For example, each buffer 315 may be associated with the big-z operation 320 or the little-z operation 325, where a given buffer 315 is a space of the memory system where the data is accumulated before being written to respective memory cells of the memory system. In response to the big-z operation 320 accumulating data for storage across multiple planes 165, the big-z operation 320 may have a larger buffer 315 relative to the little-z operation 325. For example, the big-z operation 320 may have an associated buffer 315 of a first size that is greater than a buffer 315 of a second size associated with the little-z operation 330.

In some examples, the memory system may accumulate data 305 at a buffer 315 associated with the big-z operation 320, and refrain from storing the data 305 to respective memory cells until the buffer 315 may be full. In some cases, if a portion of data 305 for a given cursor 310 is less than the buffer 315 of the first size, the remaining portion of the buffer may be filled with "dummy" data (e.g., data set for garbage collection during another operation). However, while using the sequential addressing of ZNS architecture, the addition of "dummy" data may increase the mapping complexity, which may increase the use of resources causing a reduction of the performance and quality of service of the system. In some examples, one or more buffers 315 of the second size, associated with the little-z operation 330 may be used to store data to the memory cells. However, by using the plane write operation 335 to write all of data 305 may result in a slower rate of writing compared to the multi-plane write operation 330.

Additionally, in a ZNS architecture, different cursors may receive varying amounts of access operations (e.g., write operations or read operations) based on the activity of the host system. In such examples, at different times a particular zone of the ZNS architecture may be benefited by performing big-z operations and at other times the particular zone of the ZNS architecture may be benefited by performing the little-z operations based on requests on the zone made by the host system. For instance, if the zone is being heavily used by the host system, big-z operations may improve the performance of the memory system. Alternatively, if the zone is being used less heavily by the host system, little-z operations 325 may reduce the SRAM resources used by a given cursor 310, increasing the efficiency of the memory system and reducing the cost.

As such, the memory system may dynamically switch zones between using the big-z operation 320 and the little-z operation 325 in response to the amount of data 305 associated with each zone (e.g., each cursor associated with the respective zone). For example, the cursor 310-*a* may be associated with the buffer 315-*a* in response to one or more performance aspects associated with cursor 310-*a*. For example, the cursor 310-*a* may have a quantity of write commands pending such that the portion of data 305 associated with the cursor 310-*a* may satisfy a data threshold. As such, the cursor 310-*a* may be associated with buffer 315-*a* which may be an example of a buffer 315 of a first size associated with the big-z operation 320.

Additionally or alternatively, the memory system may assign cursors 310-*b* through 310-*n* with respective buffers 315-*b* through 315-*n*, where the buffers 315-*b* through 315-*n* may be examples of buffers of the second size associated with the little-z operation 325. The cursors 310-*b* through 310-*n* may be associated with buffers of the second size in response to not satisfying the data threshold. In some examples, one or more performance aspects for a given cursor may change over time. For example, if the cursor 310-*b* is of the second size and the amount of data associated with the cursor 310-*b* increases such that the data threshold is satisfied, the cursor 310-*b* may be updated the first size and associated with the big-z operation 320.

In some examples, the portion of data 305 associated with cursor 310-*a* may be greater than the buffer 315-*a*. As such, the buffer 315-*a* may accumulate the portion of data 305 from the cursor 310-*a* until the buffer 315-*a* is full. In examples where the buffer 315-*a* is full, the buffer 315-*a* may store the accumulated data 305 to the designated memory cells of the memory die 160 in accordance with the multi-plane write operation 330. In some examples, the buffer 315-*a* may also write an indication that the multi-plane write operation 330 was used to store the accumulated data 305. After storing the accumulated data 305 from the buffer 315-*a* (e.g., flushing buffer 315-*a*), if the remaining portion of data 305 from cursor 310-*a* is greater than buffer 315-*a*, then the buffer 315-*a* may be filled again until the remaining portion of data 305 is less than the buffer 315-*a* size.

Additionally or alternatively, if the remaining portion of data 305 from cursor 310-*a* is less than the buffer 315-*a* size, and cursor 310-*a* is currently associated with the big-z operation 320, the size of the buffer 315-*a* may be progressively reduced. For example, the memory system may determine to flush the data using the little-z operation 325 if the remaining portion of the data 305 is less than the buffer 315-*a* size.

In some examples, the portion of data 305 associated with cursor 310-*a* may be greater than the buffer 315-*a*. As such, the cursor 310-*a* might request a buffer increase. For example, if the buffer 315-*a* is associated with the little-z operation 325, the cursor 310-*a* may indicate a request to the memory system (e.g., a buffer manager associated with the memory system) to switch from the buffer 315-*a* to a buffer 315 associated with the big-z operation 320. Additionally or alternatively, the memory system may use buffer 315-*a* to receive the data 305 of cursor 310-*a* by repeatedly filling the buffer 315-*a* and flushing buffer 315-*a* (e.g., writing the data to the memory cells of the memory system), until all the data 305 of cursor 310-*a* is written to the memory system . . . .

In some examples of L2P compression techniques, the memory system may write an indication of the data layout of the memory system (e.g., data 305 written via big-z operation 330 or data 305 written via little-z operation 335). Further discussion of mapping data layout in accordance with multiple types of write operations is described herein, including with reference to FIG. 4.

In some examples, such as ZNS techniques, the granularity of compression may match the zone size. For instance, the memory system may map zones into one or more virtual blocks, without the use of an L2P map. As such, layout tracking between logical address and the physical location of the stored data 305 may be implemented with an additional table per zone where the zone may be divided in layout-sub-zones (LSZ). In some examples, the size of sub-zones may correspond to the big-z operation 320 that uses a buffer 315 of the first size (e.g., a big-z buffer 315) or a multiple of the big-z buffer 315. As such, the total amount of data 305 in a given sub-zone may be independent of the data layout (e.g., a big-z parallel plane 165 data layout or a little-z sequential plane 165 data layout). As such, the address translation might identify the sub-zone independently of the physical layout of data 305. The position of an associated PTU in sub-zone may be calculated separately and in parallel (e.g., via dedicated engines of the memory system or various look up tables) for each layout supported by the system, while retrieving the layout information associated with the sub-zone. Further discussion of sub-zone mapping is described herein, including with reference to FIG. 4.

In some other examples, where the memory system uses an L2P table, the layout mapping may be implemented as part of the L2P compressed table. For example, the table or an pointer associated with the table may contain a bit or a bit field to indicate the layout of the pointed physical area.

Figure 4:
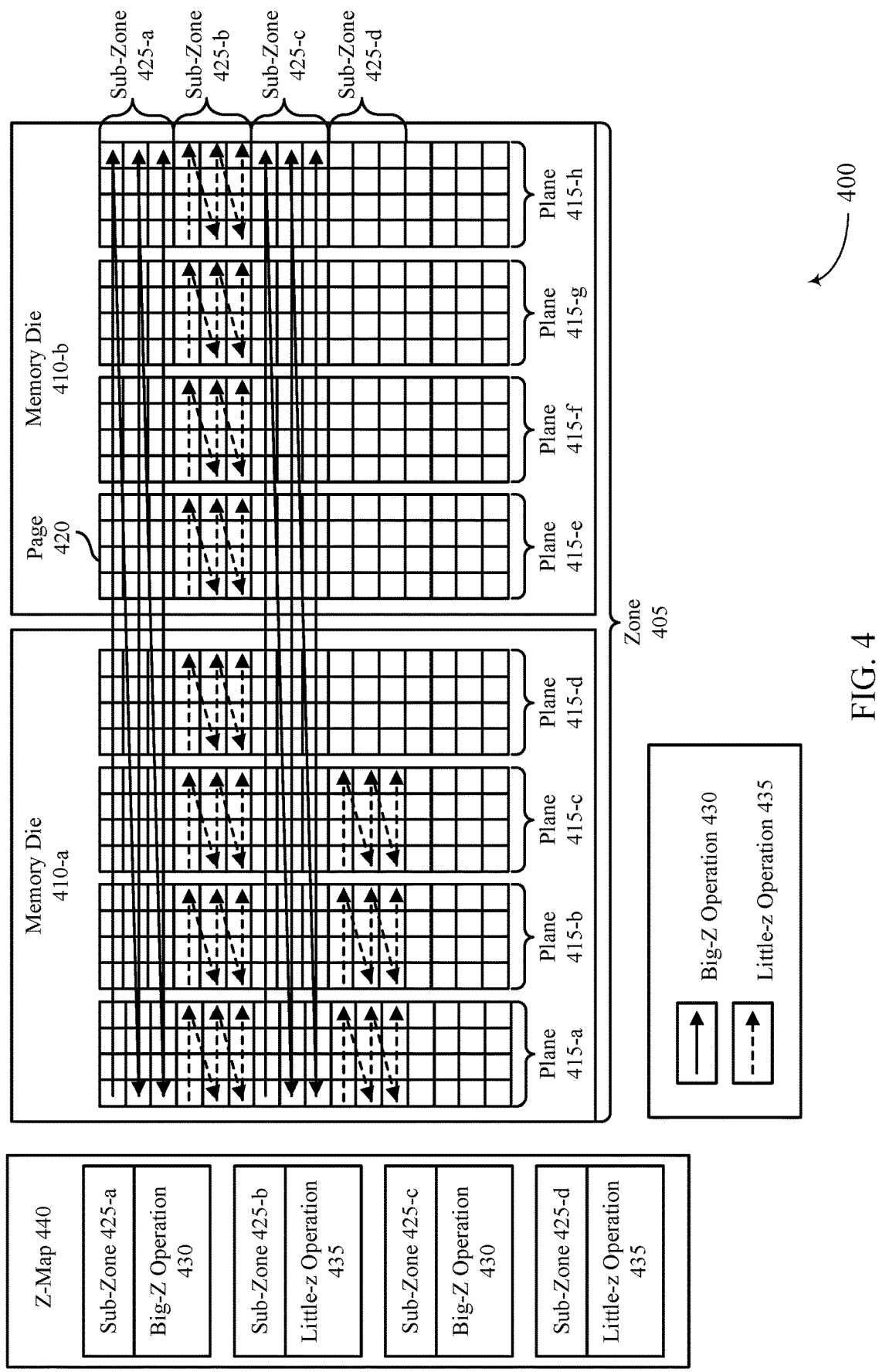
FIG. 4 illustrates an example of a zone mapping scheme that supports configurable types of write operations in accordance with examples as disclosed herein.

FIG. 4 illustrates an example of a zone mapping scheme 400 that supports configurable types of write operations in accordance with examples as disclosed herein. In some examples, zone mapping scheme 400 may be implemented by one or more aspects of system 100, system 200, data flow diagram 300, or a combination thereof. For instance, zone mapping scheme 400 may be implemented by a memory system 110 and host system 105 as described with reference to FIG. 1 and/or a memory system 210 and host system 205 as described with reference to FIG. 2. Additionally or alternatively, memory dies 410 may be examples of dies 160, planes 410 may be examples of planes 165, and page 420 may be an example of a page 175, with reference to FIG. 1. Additionally or alternatively, big-Z operation 430 and little-z operation 435 may be respective examples of big-Z operation 320 and little-z operation 325 with reference to FIG. 3.

As illustrated in FIG. 4, a memory system may include one or more memory dies 410 (e.g., memory die 410-*a* and memory die 410-*b*) where each memory die 410 may include one or more planes (e.g., planes 415-*a*, 415-*b*, 415-*c*, 415-*d*, 415-*e*, 415-*f*, 415-*g*, and 415-*h*). In some examples, the memory die 410-*a* and 410-*b* may be associated with a zone 405 in accordance with ZNS architecture. As such, the memory system may receive one or more write commands from a host device, where data associated with the write commands may be written sequentially to zone 405 of the memory system. In some examples, the memory system may operate in accordance with the big-z operation 430, the little-z operation 435, or a combination thereof to write data to the memory dies 410 of the zone 405.

Additionally or alternatively, the zone 405 may be further separated into sub-zones 425 in accordance with an LSZ scheme. In some examples, each sub-zone 425 may be of the same size. Additionally or alternatively, the size of each sub-zone 425 may be based on the buffer size associated with the big-z operation 430 (e.g., big-z buffer). For example, each sub-zone 425 may be equal to the size of the big-z buffer.

In some examples, data written to a sub-zone may be written with a big-z operation 430 or a little-z operation 435. For example, data written to sub-zone 425-*a* may be written using the big-z operation 430, where the data is written in parallel across multiple planes 415, multiple memory dies 410 or a combination thereof. Additionally or alternatively, data written to sub-zone 425-*b* may be written using the little-z operation 435, where the data is written sequentially in order of the planes 415. For instance, data may be written to the portion of plane 415-*a* of sub-zone 425-*b*, then written to the portion of plane 415-*b* of sub-zone 425-*b*, and then to the following portions of remaining planes 415 of sub-zone 425-*b* until the sub-zone 425-*b* is filled.

The arrows in FIG. 4 denote how the data would be written into different pages based on using either the big-z operation 430 or the little-z operation 435. In a simple example, there may be twelve pages to be written to the memory system as illustrated in FIG. 4. In such an example, each block of FIG. 4 may represent a page or some other sub-unit of data. If a big-z operation 430 is used in sub-zone 425-*a* to write the data, then the first through fourth pages would be written into the first plane 415-*a*, the fifth through ninth planes would be written in the second plane 415-*b* and the tenth through twelfth pages would be written in the third plane 415-*c*. If a little-z operation 435 is used in sub-zone 425-*b* to write the data, the first through twelfth pages would all be written into the first plane 415-*a*.

Based on using both big-z operation 430 and little-z operation 435 to write data to zone 405, the memory system may store one or more sets of information that may indicate the write operation used to store data to a given sub-zone 425. This may be useful the data for a read operation. In some examples, the memory system may store z-map 440 that may indicate whether the big-z operation 430 or the little-z operation 435 was used to store data to given sub-zone 425. As illustrated in the example of FIG. 4, the z-map 440 indicates that data of sub-zone 425-*a* was written using the big-z operation 430, data of sub-zone 425-*b* was written using the little-z operation 435, data of sub-zone 425-*c* was written using the big-z operation 430, and data of sub-zone 425-*d* was written using the little-z operation 435. In some examples, the z-map 440 may store the write operation used via one or more bits. For instance with reference to a given sub-zone 425, the z-map 440 may store a bit value of '1' if the data of the given sub-zone 425 was stored using the big-z operation 430 and store a bit value of '0' if the data of the given sub-zone 425 was stored using the little-z operation 435, or vice versa. In such examples, the z-map 440 may be useful for the memory system to reconstruct the locations of the data stored in the zone 405 and help the memory system read specific locations and be able to use both big-z operations 430 and little-z operations 435 in the same zone.

As such, the memory system may access data stored to zone 405 in accordance with the z-map 440. For example, the memory system may receive a read operation from the host system requesting data from a first LBA. Based on the sequential ordering of LBAs, the memory system may determine that the first LBA may be associated with the sub-zone 425-*a*. In such examples, the memory system may access z-map 440 and identify that the sub-zone 425-*a* was stored using the big-z operation 430. As such, the memory system may use the value of the first LBA as an offset relative to the start of sub-zone 425-*a* to determine the physical location of the associated data. In the example of FIG. 4, the memory system may determine that the first LBA is offset 17 spots from the start of sub-zone 425-*a*. Based on identifying the offset and the write operation used, the memory system may determine that the data requested by the host system is stored at in page 420-*a* of plane 415-*e* of memory die 410-*b*. As such, the memory system may read and transmit the data of page 420-*a* to the host system.

In some examples, a write command may partially fill a sub-zone 425 with data. For example with reference to FIG. 4, sub-zone 425-*d* may be partially filled with data. In such examples, the rest of the sub-zone 425-*d* may be filled using the same write operation. For example, since the first portion of sub-zone 425-*d* was stored via little-z operation 435, the remaining portion of sub-zone 425-*d* may be stored via the little-z operation 435. Further examples of determining which write operation to use for a given sub-zone 425 are described herein, including with reference to FIG. 5.

Figure 5:
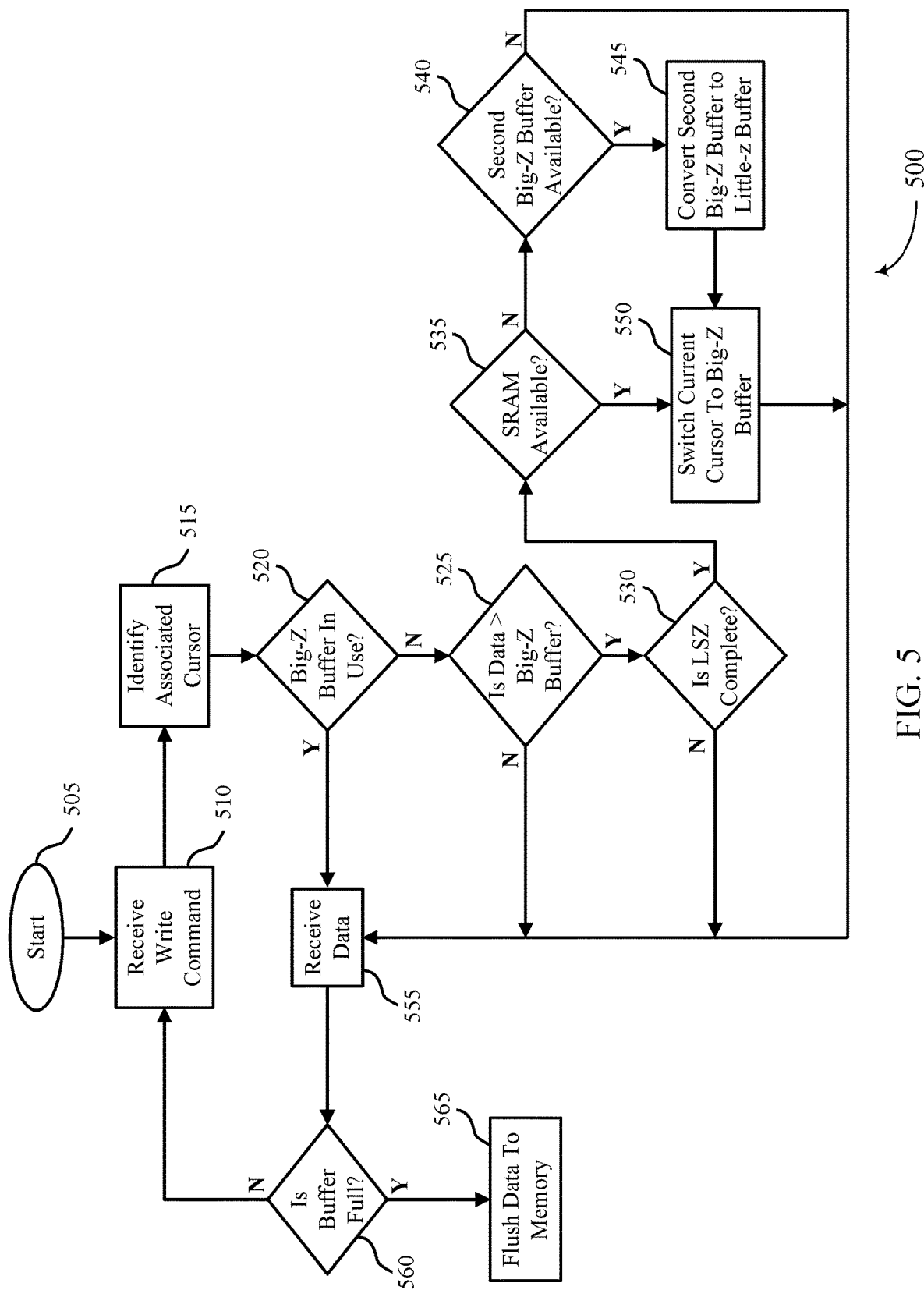
FIG. 5 illustrates an example of a process flow that supports configurable types of write operations in accordance with examples as disclosed herein.

FIG. 5 illustrates an example of a process flow 500 that supports configurable types of write operations in accordance with examples as disclosed herein. In some examples, process flow 500 may be implemented by one or more aspects of systems 100 and/or 200. For instance, process flow 500 may be implemented by a memory system 110 as described with reference to FIG. 1 and/or a memory system 210 as described with reference to FIG. 2. In some examples, process flow 500 may correspond to one or more types of writing and reading operations (e.g., big-z operation 320 and little-z operation 330) with reference to FIG. 3. Aspects of the process flow 500 may be implemented by a controller, among other components. Additionally, or alternatively, aspects of the process flow 500 may be implemented as instructions stored in memory (e.g., firmware stored in a memory coupled with a controller). For example, the instructions, in response to being executed by a controller (e.g., the memory system controller 115), may cause the controller to perform the operations of the process flow 500.

At 505, the memory system, the host system, or a combination thereof may perform a startup procedure.

At 510, the memory system may receive a write command from the host system. The write command may indicate to write data in a zone of the memory system associated with a ZNS architecture for the memory system.

At 515, the memory system may identify a physical address to store the data using a cursor associated with the zone based on receiving the write command. In some example, the cursor may be associated with a type of a write operation based on a quantity of data associated with the cursor.

At 520, the memory system may determine a type of buffer in use to receive the data from the host system. In some examples, the buffer may be an example of a big-z buffer associated with a big-z operation (e.g., a first buffer type of a first size). Additionally or alternatively, the buffer may be an example of a little-z buffer associated with a little-z operation (e.g., a second buffer type of a second size smaller than the first size).

In some examples, the big-z operation may be an example of a first type of the write operation associated with writing information in multiple planes of the memory system and associated with the big-z buffer of the first size. In some examples, the big-z operation may be associated with writing information in multiple planes of the memory system. For instance, the big-z operation may be associated with writing information in six or more planes of the memory system. Additionally, or alternatively, the little-z operation may be an example of a second type of the write operation associated with writing information in one or more planes of the memory system and is associated with the little-z buffer of the second size that is less than the first size. In some examples, the little-z operation may be associated with writing information in one plane of the memory system at a given time. In some examples, the little-z operation may be associated with writing information to one or two planes of the memory system at a given time.

If at 520, the big-z buffer is in use, then at 555, the big-z buffer may be used to receive the data from the host system.

If at 520, the big-z buffer is not in use (e.g., a little-z buffer is in use), then at 525, the memory system may determine whether the quantity of data from the host system in greater than the big-z buffer size.

If at 525, the data is not greater than the big-z buffer size, then at 565, the memory system may flush the data (e.g., write the data to the memory of the memory system) using the little-z operation.

If at 525, the data is greater than the big-z buffer size, then at 530, the memory system may determine if a current sub-zone receiving data is full (e.g., if the LSZ is complete).

If at 530, the current sub-zone is not full (e.g., the LSZ is not complete), then at 555, the memory system may receive the data from the host system using the little-z buffer.

If at 530, the current sub-zone is full (e.g., the LSZ is complete), then at 535, the memory system may determine whether there is additional SRAM of the memory system available to configure one or more buffers.

If at 535, there is additional SRAM available, then at 550, the memory system may update the current cursor in use from the little-z buffer to a big-z buffer by using the additional SRAM. At 555, the updated big-z buffer may receive the data from the host system.

If at 535, there is not additional SRAM available, then at 540, the memory system may determine if there is a big-z buffer available for use.

If at 540, there is a big-z buffer available for use, then at 545, the memory system may convert the big-z buffer to one or more little-z buffers and flush the data to memory. As such, at 550, the memory system may convert the one or more little-z buffers back to the big-z buffer and update the current cursor in use from the little-z buffer to the big-z buffer. At 555, the updated big-z buffer may receive the data from the host system.

If at 540, there is not a big-z buffer available for use, then at 555, the little-z buffer in use may receive the data from the host system.

Based on the respective buffer in use receiving the data at 555, at 560 the memory system may determine if the respective buffer in use is full.

If at 560, the respective buffer is full, the buffer may flush the data to the memory of the memory system.

If at 560, the respective buffer is not full, then at 510, the respective buffer may be used to receive an additional write command.

Figure 6:
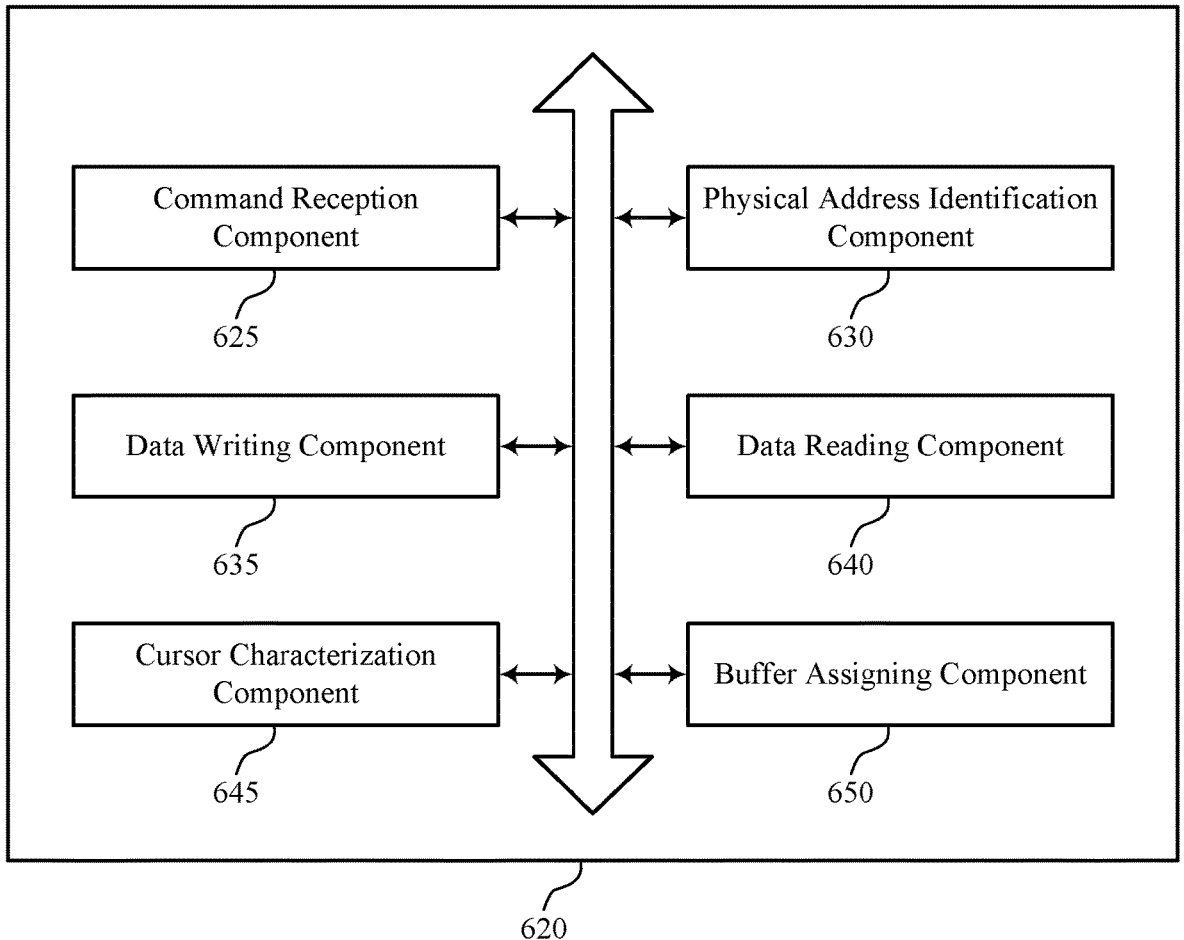
FIG. 6 shows a block diagram of a memory system that supports configurable types of write operations in accordance with examples as disclosed herein.

FIG. 6 shows a block diagram 600 of a memory system 620 that supports configurable types of write operations in accordance with examples as disclosed herein. The memory system 620 may be an example of aspects of a memory system as described with reference to FIGS. 1 through 4. The memory system 620, or various components thereof, may be an example of means for performing various aspects of configurable types of write operations as described herein. For example, the memory system 620 may include a command reception component 625, a physical address identification component 630, a data writing component 635, a data reading component 640, a cursor characterization component 645, a buffer assigning component 650, or any combination thereof. Each of these components may communicate, directly or indirectly, with one another (e.g., via one or more buses).

The command reception component 625 may be configured as or otherwise support a means for receiving a write command to write data in a zone of a memory system associated with a zoned namespace architecture for the memory system. The physical address identification component 630 may be configured as or otherwise support a means for identifying a physical address to store the data using a cursor associated with the zone based at least in part on receiving the write command, the cursor being associated with a type of a write operation based at least in part on a quantity of data associated with the cursor. The data writing component 635 may be configured as or otherwise support a means for writing, to a sub-zone of the zone, using a first type of the write operation or a second type of the write operation in accordance with the quantity of data and based at least in part on identifying the physical address. The data writing component 635 may be configured as or otherwise support a means for writing an indication of the type of the write operation used to write the data into the memory system to the sub-zone based at least in part on writing the data to the sub-zone.

In some examples, the data reading component 640 may be configured as or otherwise support a means for reading the data from the memory system at the physical address in accordance with a type of read operation associated with the type of the write operation used to write the data. In some examples, the data reading component 640 may be configured as or otherwise support a means for receiving a read command to read the quantity of data from the sub-zone of the memory system, access the indication associated with the sub-zone, and reading, from the sub-zone, the quantity of data from the sub-zone at the physical address based at least in part on the indication of the type of the write operation used to write the data into the memory system to the sub-zone.

In some examples, a first type of read operation is associated with the first type of the write operation and a second type of read operation is associated with the second type of the write operation.

In some examples, the type of read operation is based at least in part on a quantity of data associated with a read operation and a buffer availability.

In some examples, the data writing component 635 may be configured as or otherwise support a means for storing, to the logical-to-physical mapping, a bit that associates the indication with the sub-zone associated with the physical address of the quantity of data.

In some examples, the cursor characterization component 645 may be configured as or otherwise support a means for determining whether the cursor is receiving more information for write operations than a second cursor based at least in part on receiving the write command, where an amount of information of the cursor satisfies an information threshold. In some examples, the buffer assigning component 650 may be configured as or otherwise support a means for assigning a first buffer of a first size to the cursor based at least in part on determining that the cursor is receiving more information than the second cursor and the cursor satisfying the information threshold, where the first buffer is associated with the first type of the write operation.

In some examples, the buffer assigning component 650 may be configured as or otherwise support a means for assigning a second buffer of a second size to the second cursor based at least in part on determining that the cursor is receiving more information than the second cursor, where the second buffer is associated with the second type of the write operation.

In some examples, the first type of the write operation is associated with writing information in multiple planes of the memory system and is associated with a first buffer of a first size. In some examples, the second type of the write operation is associated with writing information in one or more planes of the memory system and is associated with a second buffer of a second size that is less than the first size.

In some examples, the cursor characterization component 645 may be configured as or otherwise support a means for identifying that a size of the data allocated to the cursor is greater than or equal to the first size of the first buffer. In some examples, the data writing component 635 may be configured as or otherwise support a means for writing a portion of the data associated with the command to the first buffer based at least in part on identifying that the size is greater than or equal to the first size. In some examples, the data writing component 635 may be configured as or otherwise support a means for writing, using the first type of the write operation, the portion of the data and an indication that the first type of the write operation is used to write the portion of the data into the memory system based at least in part on writing the portion.

In some examples, the data writing component 635 may be configured as or otherwise support a means for writing a remaining portion of the data to one or more second buffers, where the remaining portion of the data is less than or equal to a total size of the one or more second buffers. In some examples, the data writing component 635 may be configured as or otherwise support a means for writing, using the second type of the write operation, the remaining portion of the data and an indication that the second type of the write operation is used to write the remaining portion of the data into the memory system based at least in part on the remaining portion of the quantity of data being less than or equal to the total size of the one or more second buffers.

In some examples, the data writing component 635 may be configured as or otherwise support a means for writing the data associated with the command and the cursor to the first buffer. In some examples, the cursor characterization component 645 may be configured as or otherwise support a means for identifying that a size of the data is less than the first size of the first buffer. In some examples, the data writing component 635 may be configured as or otherwise support a means for writing, using the second type of the write operation, the data, and an indication that the second type of the write operation is used to write the data into the memory system based at least in part on identifying that the size of the data is less that the first size of the first buffer.

In some examples, the first type of the write operation is associated with writing information in multiple planes of the memory system. In some examples, the second type of the write operation is associated with writing information in one plane of the memory system.

In some examples, the first type of write operation is associated with writing information in six or more planes of the memory system. In some examples, the second type of the write operation is associated with writing information to one or two planes of the memory system.

Figure 7:
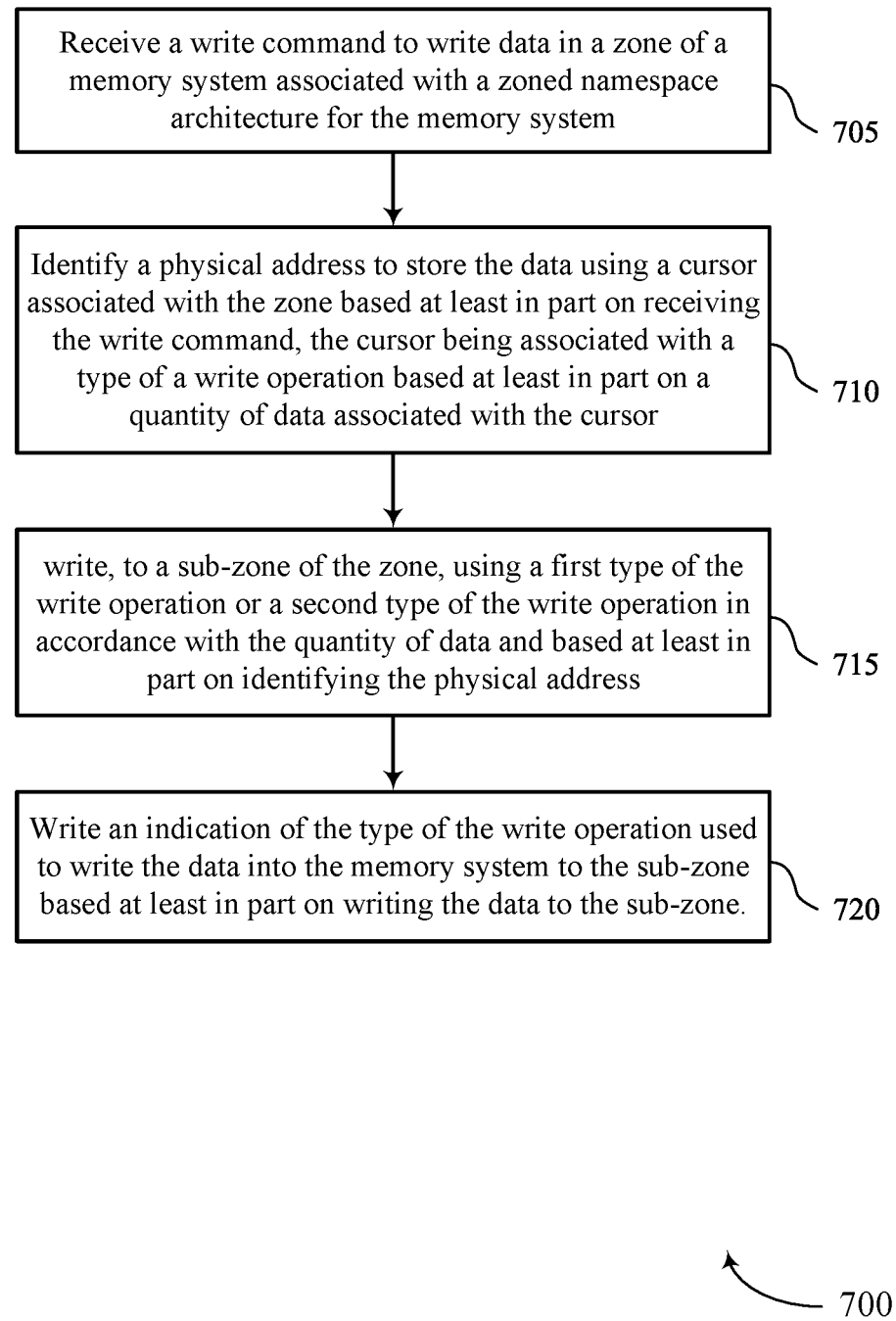
FIG. 7 shows a flowchart illustrating a method or methods that support configurable types of write operations in accordance with examples as disclosed herein.

FIG. 7 shows a flowchart illustrating a method 700 that supports configurable types of write operations in accordance with examples as disclosed herein. The operations of method 700 may be implemented by a memory system or its components as described herein. For example, the operations of method 700 may be performed by a memory system as described with reference to FIGS. 1 through 6. In some examples, a memory system may execute a set of instructions to control the functional elements of the device to perform the described functions. Additionally, or alternatively, the memory system may perform aspects of the described functions using special-purpose hardware.

At 705, the method may include receiving a write command to write data in a zone of a memory system associated with a zoned namespace architecture for the memory system. The operations of 705 may be performed in accordance with examples as disclosed herein. In some examples, aspects of the operations of 705 may be performed by a command reception component 625 as described with reference to FIG. 6.

At 710, the method may include identifying a physical address to store the data using a cursor associated with the zone based at least in part on receiving the write command, the cursor being associated with a type of a write operation based at least in part on a quantity of data associated with the cursor. The operations of 710 may be performed in accordance with examples as disclosed herein. In some examples, aspects of the operations of 710 may be performed by a physical address identification component 630 as described with reference to FIG. 6.

At 715, the method may include writing, to a sub-zone of the zone, using a first type of the write operation or a second type of the write operation in accordance with the quantity of data and based at least in part on identifying the physical address. The operations of 715 may be performed in accordance with examples as disclosed herein. In some examples, aspects of the operations of 715 may be performed by a data writing component 635 as described with reference to FIG. 6.

At 720, the method may include writing an indication of the type of the write operation used to write the data into the memory system to the sub-zone based at least in part on writing the data to the sub-zone. The operations of 720 may be performed in accordance with examples as disclosed herein. In some examples, aspects of the operations of 720 may be performed by a data writing component 635 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a write command to write data in a zone of a memory system associated with a zoned namespace architecture for the memory system; identifying a physical address to store the data using a cursor associated with the zone based at least in part on receiving the write command, the cursor being associated with a type of a write operation based at least in part on a quantity of data associated with the cursor; writing, to a sub-zone of the zone, using a first type of the write operation or a second type of the write operation in accordance with the quantity of data and based at least in part on identifying the physical address; and writing an indication of the type of the write operation used to write the data into the memory system to the sub-zone based at least in part on writing the data to the sub-zone.

Aspect 2: The method, apparatus, or non-transitory computer-readable medium of aspect 1, further including operations, features, circuitry, logic, means, or instructions, or any combination thereof for reading the data from the memory system at the physical address in accordance with a type of read operation associated with the type of the write operation used to write the data.

Aspect 3: The method, apparatus, or non-transitory computer-readable medium of any of aspects 1 through 2, further including operations, features, circuitry, logic, means, or instructions, or any combination thereof for receiving a read command to read the quantity of data from the sub-zone of the memory system; accessing the indication associated with the sub-zone; and reading, from the sub-zone, the quantity of data from the sub-zone at the physical address based at least in part on the indication of the type of the write operation used to write the data into the memory system to the sub-zone.

The method, apparatus, or non-transitory computer-readable medium of aspect 2, where a first type of read operation is associated with the first type of the write operation and a second type of read operation is associated with the second type of the write operation.

Aspect 4: The method, apparatus, or non-transitory computer-readable medium of any of aspects 2 through 3, where the type of read operation is based at least in part on a quantity of data associated with a read of operation and a buffer availability.

Aspect 5: The method, apparatus, or non-transitory computer-readable medium of any of aspects 1 through 4, further including operations, features, circuitry, logic, means, or instructions, or any combination thereof for storing, to the logical-to-physical mapping, a bit that associates the indication with the sub-zone associated with the physical address of the quantity of data.

Aspect 6: The method, apparatus, or non-transitory computer-readable medium of any of aspects 1 through 5, further including operations, features, circuitry, logic, means, or instructions, or any combination thereof for determining whether the cursor is receiving more information for write operations than a second cursor based at least in part on receiving the write command, where an amount of information of the cursor satisfies an information threshold and assigning a first buffer of a first size to the cursor based at least in part on determining that the cursor is receiving more information than the second cursor and the cursor satisfying the information threshold, where the first buffer is associated with the first type of the write operation.

Aspect 7: The method, apparatus, or non-transitory computer-readable medium of aspect 6, further including operations, features, circuitry, logic, means, or instructions, or any combination thereof for assigning a second buffer of a second size to the second cursor based at least in part on determining that the cursor is receiving more information than the second cursor, where the second buffer is associated with the second type of the write operation.

Aspect 8: The method, apparatus, or non-transitory computer-readable medium of any of aspects 1 through 7, where the first type of the write operation is associated with writing information in multiple planes of the memory system and is associated with a first buffer of a first size and the second type of the write operation is associated with writing information in one or more planes of the memory system and is associated with a second buffer of a second size that is less than the first size.

Aspect 9: The method, apparatus, or non-transitory computer-readable medium of aspect 8, further including operations, features, circuitry, logic, means, or instructions, or any combination thereof for identifying that a size of the data allocated to the cursor is greater than or equal to the first size of the first buffer; writing a portion of the data associated with the command to the first buffer based at least in part on identifying that the size is greater than or equal to the first size; and writing, using the first type of the write operation, the portion of the data and an indication that the first type of the write operation is used to write the portion of the data into the memory system based at least in part on writing the portion.

Aspect 10: The method, apparatus, or non-transitory computer-readable medium of aspect 9, further including operations, features, circuitry, logic, means, or instructions, or any combination thereof for writing a remaining portion of the data to one or more second buffers, where the remaining portion of the data is less than or equal to a total size of the one or more second buffers and writing, using the second type of the write operation, the remaining portion of the data and an indication that the second type of the write operation is used to write the remaining portion of the data into the memory system based at least in part on the remaining portion of the quantity of data being less than or equal to the total size of the one or more second buffers.

Aspect 11: The method, apparatus, or non-transitory computer-readable medium of any of aspects 8 through 10, further including operations, features, circuitry, logic, means, or instructions, or any combination thereof for writing the data associated with the command and the cursor to the first buffer; identifying that a size of the data is less than the first size of the first buffer; and writing, using the second type of the write operation, the data and an indication that the second type of the write operation is used to write the data into the memory system based at least in part on identifying that the size of the data is less that the first size of the first buffer.

Aspect 12: The method, apparatus, or non-transitory computer-readable medium of any of aspects 1 through 11, where the first type of the write operation is associated with writing information in multiple planes of the memory system and the second type of the write operation is associated with writing information in one plane of the memory system.

Aspect 13: The method, apparatus, or non-transitory computer-readable medium of any of aspects 1 through 12, where the first type of write operation is associated with writing information in six or more planes of the memory system and the second type of the write operation is associated with writing information to one or two planes of the memory system.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed, and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed, and second condition or action may occur directly as a result of the previous condition or action occurring independent of whether other conditions or actions occur. In some examples, a first condition or action may be performed, and second condition or action may occur directly as a result of the previous condition or action occurring, such that no other intermediate conditions or actions occur between the earlier condition or action and the second condition or action, or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
processing circuitry configured to couple with one or more memory devices, wherein the processing circuitry is configured to cause the memory system to:
receive a write command to write data in a zone of the memory system associated with a zoned namespace architecture for the memory system;
identify a physical address to store the data using a cursor associated with the zone based at least in part on receiving the write command, the cursor being associated with a type of a write operation, the type of the write operation being based at least in part on a quantity of data associated with the cursor;
write, to a sub-zone of the zone, using the type of the write operation in accordance with the quantity of data and based at least in part on identifying the physical address, the type of the write operation being one of a first type of the write operation associated with writing information in multiple planes of the memory system or a second type of the write operation associated with writing information in one plane of the memory system; and
write, to a logical-to-physical mapping, an indication of the type of the write operation used to write the data into the sub-zone based at least in part on writing the data to the sub-zone.

2. The memory system of claim 1, wherein the processing circuitry is further configured to cause the memory system to:
read the data from the memory system at the physical address in accordance with a type of read operation associated with the type of the write operation used to write the data.

3. The memory system of claim 2, wherein the processing circuitry is further configured to cause the memory system to:
receive a read command to read the quantity of data from the sub-zone of the memory system;
access the indication associated with the sub-zone; and
read, from the sub-zone, the quantity of data from the sub-zone at the physical address based at least in part on the indication of the type of the write operation used to write the data into the memory system to the sub-zone.

4. The memory system of claim 2, wherein the type of read operation is based at least in part on a quantity of data associated with the type of read operation and a buffer availability.

5. The memory system of claim 1, wherein, to write the indication to the logical-to-physical mapping, the processing circuitry further configured to cause the memory system to:
store, to the logical-to-physical mapping, a bit that associates the indication with the sub-zone associated with the physical address of the quantity of data.

6. The memory system of claim 1, wherein:
the first type of the write operation is associated with a first buffer of a first size; and
the second type of the write operation is associated with a second buffer of a second size that is less than the first size.

7. The memory system of claim 6, wherein the processing circuitry is further configured to cause the memory system to:
identify that a size of the data allocated to the cursor is greater than or equal to the first size of the first buffer;
write a portion of the data associated with the write command to the first buffer based at least in part on identifying that the size is greater than or equal to the first size; and
write, using the first type of the write operation, the portion of the data and an indication that the first type of the write operation is used to write the portion of the data into the memory system based at least in part on writing the portion.

8. The memory system of claim 7, wherein the processing circuitry is further configured to cause the memory system to:
write a remaining portion of the data to one or more second buffers, wherein the remaining portion of the data is less than or equal to a total size of the one or more second buffers; and
write, using the second type of the write operation, the remaining portion of the data and an indication that the second type of the write operation is used to write the remaining portion of the data into the memory system based at least in part on the remaining portion of the quantity of data being less than or equal to the total size of the one or more second buffers.

9. The memory system of claim 6, wherein the processing circuitry is further configured to cause the memory system to:
write the data associated with the write command and the cursor to the first buffer;
identify that a size of the data is less than the first size of the first buffer; and
write, using the second type of the write operation, the data and an indication that the second type of the write operation is used to write the data into the memory system based at least in part on identifying that the size of the data is less that the first size of the first buffer.

10. The memory system of claim 1, wherein:
the first type of the write operation is associated with writing information in six or more planes of the memory system.

11. A memory system, comprising:
processing circuitry configured to couple with one or more memory devices, wherein the processing circuitry is configured to cause the memory system to:
receive a write command to write data in a zone of the memory system associated with a zoned namespace architecture for the memory system;
determine whether a cursor associated with the zone is receiving more information for write operations than a second cursor based at least in part on receiving the write command, wherein an amount of information of the cursor satisfies an information threshold;
assign a first buffer of a first size to the cursor based at least in part on determining that the cursor is receiving more information than the second cursor and the cursor satisfying the information threshold, wherein the first buffer is associated with a first type of a write operation;
identify a physical address to store the data using the cursor based at least in part on receiving the write command, the cursor being associated with the first type of the write operation based at least in part on the first buffer being assigned to the cursor;
write, to a sub-zone of the zone, using the first type of the write operation based at least in part on identifying the physical address; and
write an indication of the first type of the write operation used to write the data into the sub-zone based at least in part on writing the data to the sub-zone.

12. The memory system of claim 11, wherein the processing circuitry is further configured to cause the memory system to:
assign a second buffer of a second size to the second cursor based at least in part on determining that the cursor is receiving more information than the second cursor, wherein the second buffer is associated with a second type of the write operation.

13. A non-transitory computer-readable medium storing code, the code comprising instructions executable by one or more processors to:
receive a write command to write data in a zone of a memory system associated with a zoned namespace architecture for the memory system;
identify a physical address to store the data using a cursor associated with the zone based at least in part on receiving the write command, the cursor being associated with a type of a write operation, the type of the write operation being based at least in part on a quantity of data associated with the cursor;
write, to a sub-zone of the zone, using the type of the write operation in accordance with the quantity of data and based at least in part on identifying the physical address, the type of the write operation being one of a first type of the write operation associated with writing information in multiple planes of the memory system or a second type of the write operation associated with writing information in one plane of the memory system; and
write, to a logical-to-physical mapping, an indication of the type of the write operation used to write the data into the sub-zone based at least in part on writing the data to the sub-zone.

14. The non-transitory computer-readable medium of claim 13, wherein the instructions are further executable by the one or more processors to:
read the data from the memory system at the physical address in accordance with a type of read operation associated with the type of the write operation used to write the data.

15. The non-transitory computer-readable medium of claim 14, wherein the instructions are further executable by the one or more processors to:
receive a read command to read the quantity of data from the sub-zone of the memory system;
access the indication associated with the sub-zone; and
read, from the sub-zone, the quantity of data from the sub-zone at the physical address based at least in part on the indication of the type of the write operation used to write the data into the memory system to the sub-zone.

16. The non-transitory computer-readable medium of claim 14,
wherein the type of read operation is based at least in part on a quantity of data associated with the type of read operation and a buffer availability.

17. The non-transitory computer-readable medium of claim 13, wherein, to write the indication to the logical-to-physical mapping, the instructions are further executable by the one or more processors to:
store, to the logical-to-physical mapping, a bit that associates the indication with the sub-zone associated with the physical address of the quantity of data.

18. The non-transitory computer-readable medium of claim 13, wherein:
the first type of the write operation is associated with a first buffer of a first size; and
the second type of the write operation is associated with a second buffer of a second size that is less than the first size.

19. The non-transitory computer-readable medium of claim 18, wherein the instructions are further executable by the one or more processors to:
identify that a size of the data allocated to the cursor is greater than or equal to the first size of the first buffer;
write a portion of the data associated with the write command to the first buffer based at least in part on identifying that the size is greater than or equal to the first size; and
write, using the first type of the write operation, the portion of the data and an indication that the first type of the write operation is used to write the portion of the data into the memory system based at least in part on writing the portion.

20. The non-transitory computer-readable medium of claim 19, wherein the instructions are further executable by the one or more processors to:

write a remaining portion of the data to one or more second buffers, wherein the remaining portion of the data is less than or equal to a total size of the one or more second buffers; and write, using the second type of the write operation, the remaining portion of the data and an indication that the second type of the write operation is used to write the remaining portion of the data into the memory system based at least in part on the remaining portion of the quantity of data being less than or equal to the total size of the one or more second buffers.

21. The non-transitory computer-readable medium of claim 18, wherein the instructions are further executable by the one or more processors to:

write the data associated with the write command and the cursor to the first buffer;

identify that a size of the data is less than the first size of the first buffer; and write, using the second type of the write operation, the data and an indication that the second type of the write operation is used to write the data into the memory system based at least in part on identifying that the size of the data is less that the first size of the first buffer.

22. A non-transitory computer-readable medium storing code, the code comprising instructions executable by one or more processors to:

receive a write command to write data in a zone of a memory system associated with a zoned namespace architecture for the memory system;

determine whether a cursor associated with the zone is receiving more information for write operations than a second cursor based at least in part on receiving the write command, wherein an amount of information of the cursor satisfies an information threshold;

assign a first buffer of a first size to the cursor based at least in part on determining that the cursor is receiving more information than the second cursor and the cursor satisfying the information threshold, wherein the first buffer is associated with a first type of a write operation;

identify a physical address to store the data using the cursor based at least in part on receiving the write command, the cursor being associated with the first type of the write operation based at least in part on the first buffer being assigned to the cursor;

write, to a sub-zone of the zone, using the first type of the write operation based at least in part on identifying the physical address; and write an indication of the first type of the write operation used to write the data into the sub-zone based at least in part on writing the data to the sub-zone.

23. The non-transitory computer-readable medium of claim 22, wherein the instructions are further executable by the one or more processors to:

assign a second buffer of a second size to the second cursor based at least in part on determining that the cursor is receiving more information than the second cursor, wherein the second buffer is associated with a second type of the write operation.

24. A method, comprising:

receiving a write command to write data in a zone of a memory system associated with a zoned namespace architecture for the memory system;

identifying a physical address to store the data using a cursor associated with the zone based at least in part on receiving the write command, the cursor being associated with a type of a write operation, the type of the write operation being based at least in part on a quantity of data associated with the cursor;

writing, to a sub-zone of the zone, using the type of the write operation in accordance with the quantity of data and based at least in part on identifying the physical address, the type of the write operation being one of a first type of the write operation associated with writing information in multiple planes of the memory system or a second type of the write operation associated with writing information in one plane of the memory system; and writing, to a logical-to-physical mapping, an indication of the type of the write operation used to write the data into the sub-zone based at least in part on writing the data to the sub-zone.

* * * * *